(12) United States Patent
Cho

(10) Patent No.: US 7,569,127 B1
(45) Date of Patent: Aug. 4, 2009

(54) INTERCONNECTING MICROFLUIDIC PACKAGE AND FABRICATION METHOD

(75) Inventor: Hyoung Jin Cho, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 867 days.

(21) Appl. No.: 11/044,494

(22) Filed: Jan. 27, 2005

Related U.S. Application Data

(60) Provisional application No. 60/542,564, filed on Feb. 6, 2004.

(51) Int. Cl.
 *B81C 3/00* (2006.01)
 *C12M 1/00* (2006.01)

(52) U.S. Cl. .............. 204/403.01; 204/601; 204/643; 137/814; 137/833; 422/99

(58) Field of Classification Search ............ 204/451, 204/600, 601; 137/814, 833
See application file for complete search history.

(56) References Cited

U.S. PATENT DOCUMENTS

| | | | | |
|---|---|---|---|---|
| 3,465,774 | A | 9/1969 | Kautz et al. ............ | 137/81.5 |
| 5,580,523 | A * | 12/1996 | Bard .................... | 422/50 |
| 5,882,465 | A | 3/1999 | McReynolds ............ | 156/285 |
| 6,086,825 | A | 7/2000 | Sundberg et al. .......... | 422/100 |
| 6,251,343 | B1 | 6/2001 | Dubrow et al. ............ | 422/102 |
| 6,454,924 | B2 | 9/2002 | Jedrzejewski et al. ...... | 204/601 |
| 6,615,857 | B1 | 9/2003 | Sinha et al. ............. | 437/14 |
| 6,645,432 | B1 | 11/2003 | Anderson et al. .......... | 422/100 |
| 2002/0023684 | A1 | 2/2002 | Chow ................... | 137/833 |
| 2002/0093143 | A1 | 7/2002 | Tai et al. ............... | 277/603 |
| 2002/0124896 | A1 | 9/2002 | O'Connor et al. ......... | 137/833 |
| 2003/0206832 | A1 | 11/2003 | Thiebaud et al. .......... | 422/100 |
| 2003/0224506 | A1 | 12/2003 | Agrawal et al. .......... | 435/287.2 |
| 2004/0017078 | A1 * | 1/2004 | Karp et al. .............. | 285/136.1 |

OTHER PUBLICATIONS

Gonzalez, C., et al., "Fluidic interconnects for modular assembly of chemical microsystems", Sensor and Actuators, B, vol. 49, Jun. 25, 1998, pp. 40-45.*

Puntambekar, et al., "Self-aligning microfluidic interconnects for glass- and plastic-based microfluidic systems" J. Micromech. Microeng. (2002) vol. 12 pp. 35-40.

Pattekar, et al., "Novel microfluidic interconnects for high temperature and pressure applications" J. Micromech. Microeng. (2003) vol. 13 pp. 337-345.

C. Gartner, et al., Polymer Based Microfluidic Devices—Examples for Fluidic Interfaces and Standardization Concepts, Proceedings of SPIE—International Society of Optical Engineering, vol. 4982, p. 99-104, Jan. 27-29, 2003.

* cited by examiner

*Primary Examiner*—Alex Noguerola
*Assistant Examiner*—J. Christopher Ball
(74) *Attorney, Agent, or Firm*—Brian S. Steinberger; Law Offices of Brian S. Steinberger, P.A.

(57) ABSTRACT

A one-piece, microfluidic package with standardized multiple ports allows devices to be connected in series without resorting to extra tubing connections or bonding processes. The one-piece construction consists of microfluidic channels that can be connected to fluid reservoirs and other fluidic components fabricated with interconnecting and interlocking ports. The size of the friction-fit interlocking ports is designed such that the smaller male port fits snugly into the larger female port in a manner that is leak-free and adhesive-free. The friction-fit ports can also be reconfigured. Thus, the interconnection of microfluidic packages can be in an extended series including connections to sensors and devices such as a bio/biochemical/chemical sensor chip, a dielectrophoretic manipulator chip, and a microfluidic reactor chip.

15 Claims, 8 Drawing Sheets

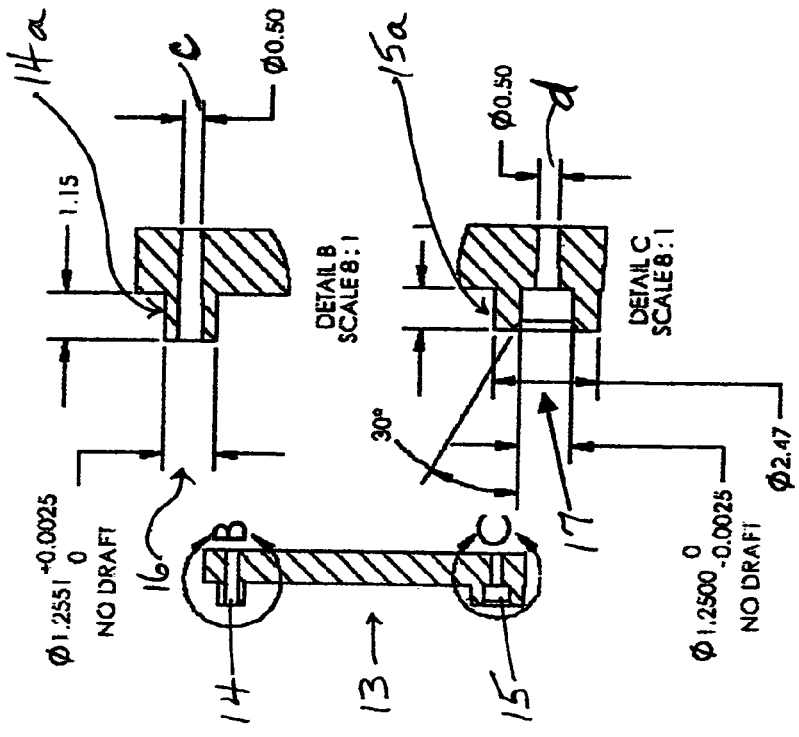
Fig. 1C
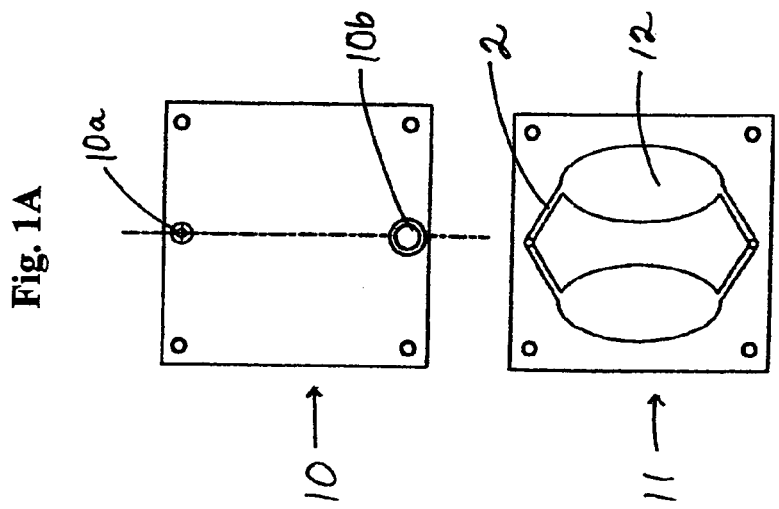
Fig. 1A
Fig. 1B
Fig. 1

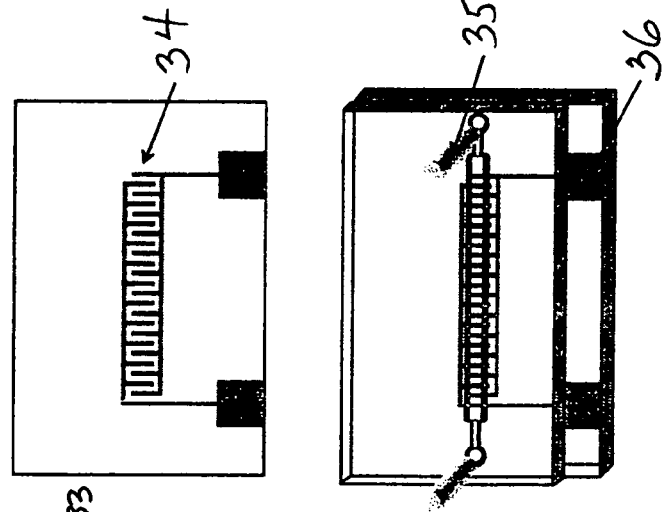
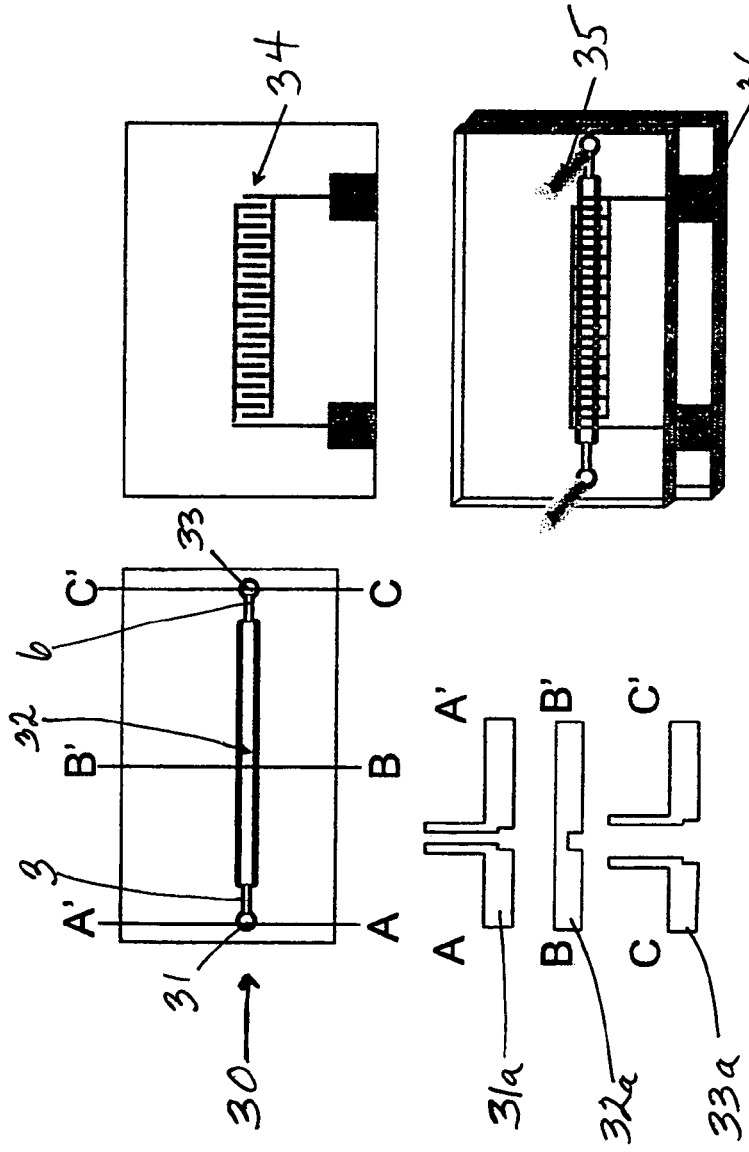
Fig. 3

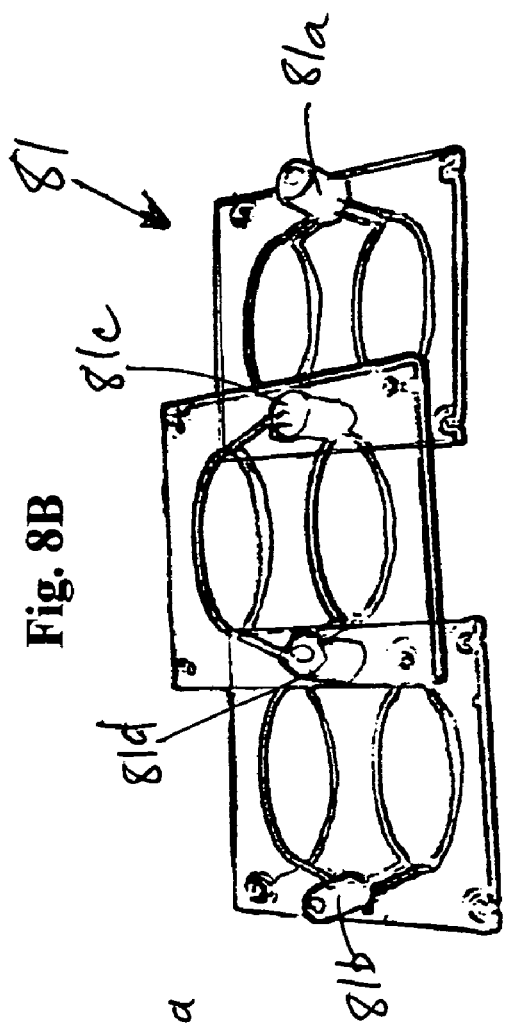
Fig. 8B
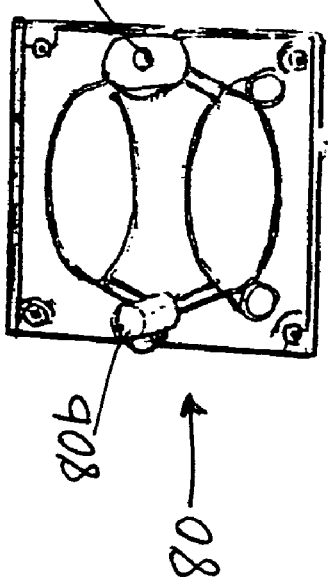
Fig. 8A
Fig. 8

INTERCONNECTING MICROFLUIDIC PACKAGE AND FABRICATION METHOD

This invention claims the benefit of priority from U.S. Provisional Application Ser. No. 60/542,564 filed Feb. 6, 2004.

FIELD OF THE INVENTION

This invention relates to microfluidic packaging, in particular to a microfluidic package having integrated, standardized, interlocking interconnections permitting the combination of multiple sensors and devices.

BACKGROUND AND PRIOR ART

Microfluidics is experiencing explosive growth in new product developments. Already there are many commercial applications for electro microfluidic devices such as chemical sensors, biological sensors, and drop ejectors for both printing and chemical analysis. The number of micromachined microfluidic devices is expected to increase dramatically in the near future. Manufacturing efficiency and integration of microfluidics with electronics will become important. In order to realize applications for these devices, an efficient method for packaging microfluidic devices is needed.

The biggest stumbling block to commercial success is the lack of general, simple and effective packaging techniques. Packaging of a miniaturized chemical analysis system, also known as a "lab-on-a-chip," is a very important element and plays several roles. Microfluidic packaging has to protect the sensitive functional unit from environmental factors that could affect its performance, like moisture, high temperature, vibration or corrosion. It also has to provide the component's connection to the outside world through electrical, optical and other types of interfaces. Not only should packaging not hinder function in any way, it should be a value-added asset. For example, a microfluidic sensor package would add this value if it contained a tiny pipeline to bring the media to be measured to the device reliably and efficiently. Other concepts have the package forming part of the sensing structure itself, becoming part of the device's own complex system instead of just a non-functional casing around it.

It is highly desirable that the MEMS (microelectromechanical systems) industry define a standard package for each application category. If a reasonable standard regarding inputs and outputs is available, then one microfluidic package can be appropriate for several different devices.

The present invention could serve as a standardization model for the microfluidics industry. Injection molded microfluidic packages with channels for fluid flow, input and output ports are integrally formed in the molded package. Shapes and sizes of the output ports are standardized and designed to interlock; thus, permitting the interconnection of microfluidic packages in an extended series. For packages that must pipe gases or liquids around on a chip, it will save on resources; it will mean that the entire sensor mechanism does not need to be replaced, just selected modules.

Microfluidic devices and networks in the prior art include, those containing multiple layers as reported in U.S. Pat. No. 6,645,432 to Anderson et al., and sealed by aligning two surfaces and removing a liquid to cause the seal. U.S. Pat. No. 6,615,857 to Sinha, et al. describes linearly arranged flow actuators fastened via bolts. A singular layer whereby the dispensing assembly and chip assembly engage each other with the assistance of alignment members, using vertical fluid channels in communication with pillars as shown in U.S. Pat. No. 6,454,924 to Jedrzejewski, et al. The sealing of the mated ports and reservoirs (U.S. Pat. No. 6,251,343 to Dubrow et al.) of the body structure include adhesives, bonding materials (U.S. Pat. No. 5,882,465 to McReynolds); negative pressure (US Pat. Appln. Pub. 2003/0206832 by Thiebaud, et al.); rubber O-rings (US Pat. Appln. Pub. 2002/0093143 by Tai, et al.); ultrasound welding, thermal processes (US Pat. Appln. 2002/0023684 by Chow), and the like.

There is a need for a reliable, easy to manufacture, inexpensive packaging architecture to make viable fluidic and electrical connections to micro machined microfluidic devices. The present invention provides consumers with an inexpensive, easy to fabricate, interconnecting, one-piece, microfluidic package suitable for snap-in (interlocking) configurations.

SUMMARY OF THE INVENTION

The first objective of the present invention is to provide a reliable, inexpensive microfluidic package.

The second objective of the present invention is to provide a microfluidic package that affords the integration of preselected, standard sized connecting channels.

The third objective of the present invention is to provide a microfluidic package of one-piece construction that is easy to manufacture.

The fourth objective of the present invention is to provide a microfluidic package with multiple ports.

The fifth objective of the present invention is to provide an injection molded microfluidic package with various shapes and sizes of ports that are standardized and designed to interlock.

The sixth objective of the present invention is to provide a microfluidic package capable of being interconnected in an extended series.

A preferred one-piece microfluidic package includes a microfluidic channel and a plurality of ports that engage via a male-female friction fit to permit interconnecting and interlocking of microfluidic packages in an extended series. In addition to the basic structure of microfluidic channel and ports the microfluidic package can have at least one fluid reservoir wherein the microfluidic channel is connected to a fluid reservoir.

A plurality of ports engage via a male-female friction fit that is leak-free and adhesive-free. Further, the plurality of ports are a set of inlet/outlet ports, preferably the set of inlet/outlet ports has two ports or a multiple of sets of inlet/outlet ports with a corresponding multiple of two ports per set.

With regard to microfluidic package design, the set of inlet/outlet ports has a first inlet/outlet port, sometimes referred to herein as the "male" port, that is smaller than a second inlet/outlet port, sometimes referred to herein as the "female" port. The first inlet/outlet port fits snugly and interlockingly into the larger second inlet/outlet port of an interconnecting microfluidic package.

Attached to the inlet/outlet ports are outlet tubes that have a pre-selected tubing size. The tubing sizes have diameters selected from at least one of approximately 1.58 millimeters (mm) or 1/16 inch, approximately 0.79 mm or 1/32 inch, and approximately 0.396 mm or 1/64 inch. The outlet tubing sizes can also be a standardized size of outlet tubes in the United States (US) and non-US countries and also sized for use in a variety of applications.

The more preferred microfluidic package can be used in interconnections in an extended series including connections to a variety of devices, such as, but not limited to, a bio/ biochemical/chemical sensor chip, a dielectrophoretic manipulator chip, and a microfluidic reactor chip.

A preferred method for fabricating a microfluidic package includes selecting a mold cavity with an inlet for injecting a molten polymer, defining a micro pattern of microfluidic channels on a first side of the mold cavity, defining a plurality of inlet/outlet ports on a second side of the mold cavity, injecting a molten polymer into the cavity, allowing the mold to cool, allowing the molten polymer to be come a rigid substrate, and removing the rigid substrate with a microfluidic channel on a first side and a plurality of inlet/outlet ports on a second side, thereby providing a one-piece, integrally formed, microfluidic package capable of interconnecting and interlocking in an extended series.

Preferably, the microfluidic channel is connected to a fluid reservoir in the micro pattern of the mold cavity. The plurality of inlet/outlet ports defined in the mold cavity has a first inlet/outlet port that is smaller than a second inlet/outlet port, so that when the microfluidic package is fabricated, the first inlet/outlet port fits snugly and interlockingly into the larger second inlet/outlet port of an interconnecting microfluidic package.

Further, the plurality of inlet/outlet ports can be connected to outlet tubes of a pre-selected tubing size. The tubing sizes have diameters selected from at least one of approximately 1.58 millimeters (mm) (1/16 inch), approximately 0.79 mm (1/32 inch), and approximately 0.396 mm (1/64 inch) and other standard sizes in the United States (US) and non-US countries.

Various methods for forming the defined structures on the first side of the polymer substrate and the second side of the polymer substrate are used and include well-known techniques such as, casting, embossing, machining, and injection molding.

Further objects and advantages of this invention will be apparent from the following detailed description of a presently preferred embodiment that is illustrated schematically in the accompanying drawings.

BRIEF DESCRIPTION OF THE FIGURES

FIG. 1 shows details of the structure of the interconnecting and interlocking microfluidic package.

FIG. 1A shows a first side of the microfluidic package with strategic locations of interconnecting inlet/outlet ports.

FIG. 1B shows a second side of the microfluidic package with connecting channels and fluid reservoirs or chambers.

FIG. 1C shows the detail and design of male-female interlocking ports enlarged on a scale of 8:1.

FIG. 3 shows how the microfluidic package of the present invention can be adapted for use as a dielectrophoretic manipulation chip.

FIG. 3A is a plan view of a microfluidic package showing a male port, a microfluidic channel and a female port.

FIG. 3B shows cross-sectional views of a male port along line A, A', a microfluidic channel along line B, B' and a female port along line C, C' of FIG. 3A.

FIG. 3C is an interdigitated array type electrode for dielectrophoretic manipulation.

FIG. 3D shows placement of a microfluidic package over the electrode of FIG. 3C to complete the dielectrophoretic cell separation chip.

FIG. 6A is a plan view of a mold insert with fluid reservoirs connected to fluid channels.

FIG. 6B is a cross-sectional view of the mold insert of FIG. 6A.

FIG. 6C is an exploded view of the mold insert and the alignment of the insert in the mold block.

FIG. 8 is an example of fabricated microfluidic packages.

FIG. 8A is a single microfluidic package.

FIG. 8B is a series of three microfluidic packages in an interconnected horizontal arrangement.

DESCRIPTION OF THE PREFERRED EMBODIMENT

Figure 2:
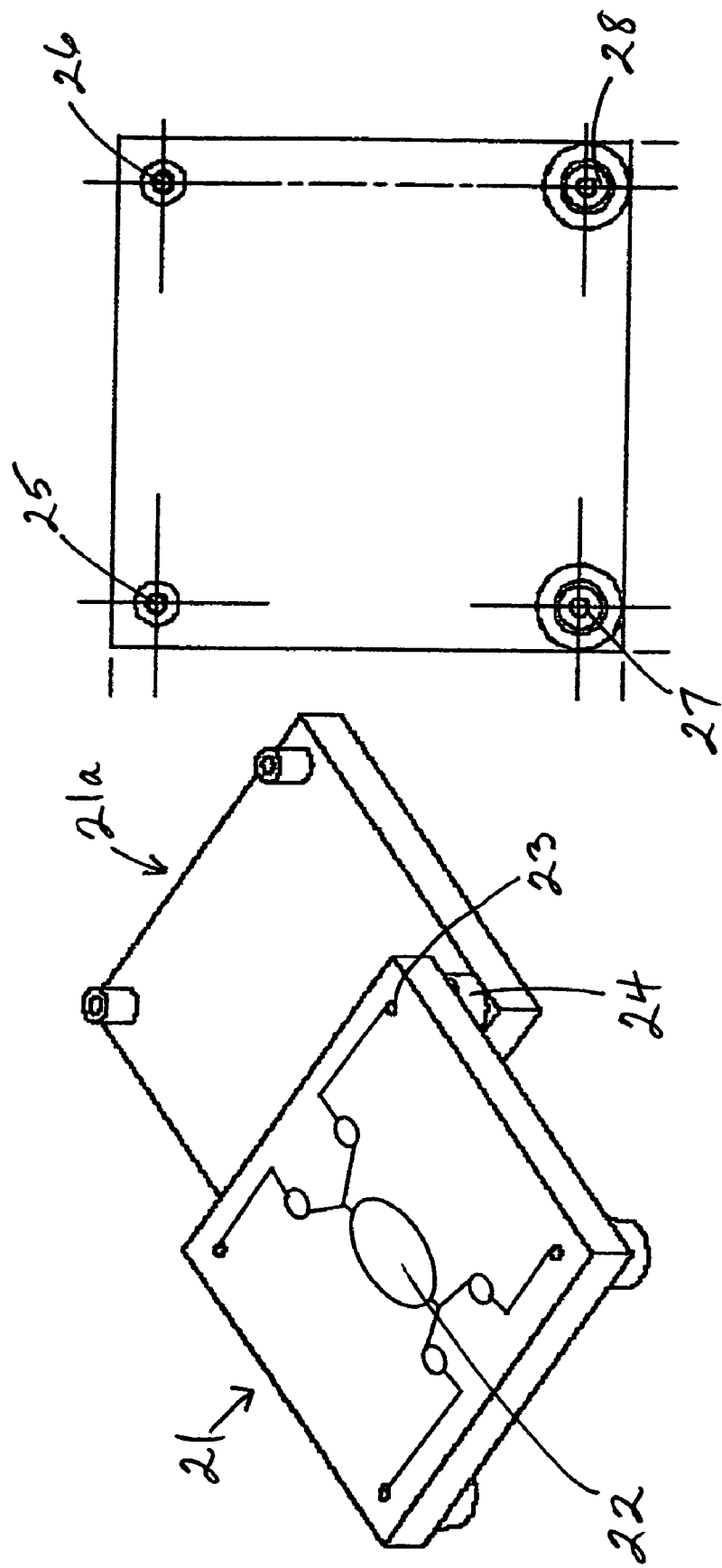
FIG. 2A shows a perspective view of two four-port microfluidic packages interconnected.
FIG. 2B shows a plan view of a first side of a four-port microfluidic package.

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

The microfluidic package of the present invention has two or multiple integrated interconnections with a pre-selected, standard size or various other sizes with one size fitting into the other. The fluidic interconnector in one component snaps in the fluidic interconnector in another component resulting in interlocking action between the components. This allows the microfluidic devices to be connected in series without resorting to extra tubing connections or bonding processes. The design of the microfluidic package also permits reconfiguration of a series of connections.

The combination of multiple sensors and devices is facilitated. Furthermore, the one-piece construction of the microfluidic packaging eliminates complicated alignment processes for attachments as reported in the prior art. In the present invention, microfluidic channels and containers and other fluidic components are fabricated on the flat side of the package simultaneously or afterwards via injection molding, embossing, casting or various other means. The fabrication method using injection molding guarantees replication of the microfluidic patterns from micro machined molds on one side while generating interconnections on the other side. This saves time and cost involved in post-processing of interconnections in various microfluidic devices.

FIG. 1 shows structural details of the microfluidic package or device of the present invention. FIG. 1A is a plan view 10 of a first side of a microfluidic package with interconnecting ports 10a and 10b. The smaller port 10a is designed to friction-fit snugly into the larger port 10b, when two microfluidic packages are interconnected. FIG. 1B shows a second side 11 of the microfluidic structure with area defined as microfluidic channels 2 and fluid reservoirs or chambers 12. In FIG. 1C, a side view 13 of the microfluidic package is shown with interlocking ports 14 and 15. Greater detail and design of each port is enlarged on a scale of 8:1. The smaller port 14a and the larger port 15a have inlet tubes c and d, respectively, wherein the diameter of the tube is approximately 0.50 millimeters (mm). Both ports 14a and 15a have outlet tubes 16 and 17, respectively, with standard tubing diameters such as, approximately 1.58 millimeters (mm) (1/16 inch), approximately 0.79 mm (1/32 inch), and approximately 0.396 mm (1/64 inch). The outer diameter of the smaller male port 14a fits into the larger female port 15a. Standardized sizes for outlet tubes 16 and 17 combined with the male-female interlocking function of the ports make this package versatile for use as a common platform between different components. The present invention is suitable for applications using pre-selected, standard size outlet tubes in the United States (US) and non-US countries. The outlet tubes can also be used in a variety of applications.

FIG. 2A illustrates the interlocking function of a microfluidic package, in which two ports in one component 21 are mating with two ports from another component 21a. A first side of the microfluidic package 21 shows the microfluidic channel and reservoir structure 22. The microfluidic structure is connected to an input port 23 and an output port 24. Fluid flows are injected through the ports, accommodated by the channels and reservoirs in the microfluidic structure and continue in channels and connections to different devices.

FIG. 2B is a plan view of the embodiment of the present invention, where a four-port design is employed. The smaller male ports 25 and 26 are designed and sized to connect and interlock with the larger female ports 27 and 28 of a different chip or microfluidic package fabricated by the process of the present invention.

FIG. 3 illustrates how the design of the present invention can be adapted for use as a dielectrophoretic manipulation chip. In FIG. 3A, a plan view 30 of a microfluidic package is shown with a microfluidic channel 32 fabricated on the bottom surface. A smaller port 31 and a larger port 33 are at opposite ends of the microfluidic channel 32 and are connected to channel 32 by fluid channels 3 and 6. FIG. 3B shows a cross-sectional view of inlet/outlet port 31a, the microfluidic channel 32a and inlet/outlet port 33a. The smaller male port 31a is sized to fit snugly and interlockingly, without the use of adhesives or bonding agents, into the larger female port 33a of an interconnecting microfluidic package.

FIG. 3C is an example of an interdigitated array type electrode 34 on a substrate for dielectrophoretic manipulation. It is understood that the electrode type can vary according to the design chosen by someone skilled in the art and is not a limitation on the present invention. Further, as an example, FIG. 3D shows a fluidic inlet/outlet 35 on the microfluidic package over the electrode and an electrical connection 36 completes the dielectrophoretic cell separation chip.

Figure 4:
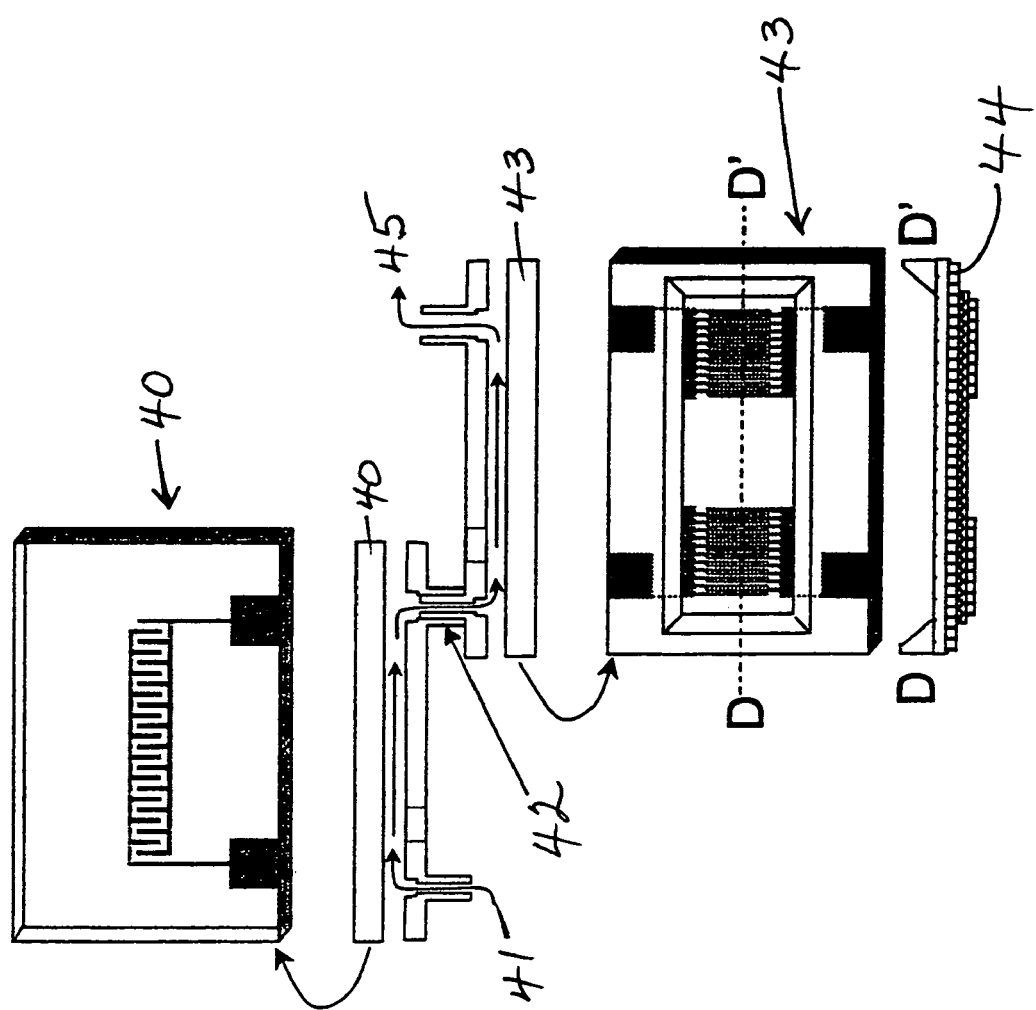
FIG. 4 is a cross-sectional view of serial connections of multiple components using interconnected microfluidic packages.

FIG. 4 illustrates the serial connection of multiple components with the present invention. Various types of devices and components can share the microfluidic package platform of the present invention and can be configured to have a new synergetic function; the type of device and component is not a limitation of the present invention. In FIG. 4, an interdigitated array type electrode on a substrate for dielectrophoretic manipulation 40 receives a fluidic sample injection through an inlet port 41; the fluid flows through interconnected and interlocked port 42, across a biosensor chip 43 and finally through outlet port 45. The arrangement of microfluidic packages in FIG. 4 includes a plan view of a dielectrophoretic manipulator chip 40, a cross-sectional view of connecting and interlocking inlet/outlet ports 41, 42, and 45, a plan view of the biosensor chip 43 and a cross-sectional view 44 of the biosensor chip 43 along the line D, D'.

Referring now to fabrication methods for the novel microfluidic package of the present invention, the packaging can be mass-produced with inexpensive polymer materials. The classes of materials that can be used to fabricate the microfluidic package include, but are not limited to, acrylics, olefins, polycarbonates, polyesters, polyethylene, polypropylene, polystyrene, polyurethane, poly vinyl compounds, fluorocarbons, epoxies, silicones and other materials useful in injection molding, casting or embossing. Thus, someone skilled in the art can select from a wide variety of materials that are compatible with fluids, devices and testing environment.

Figure 5:
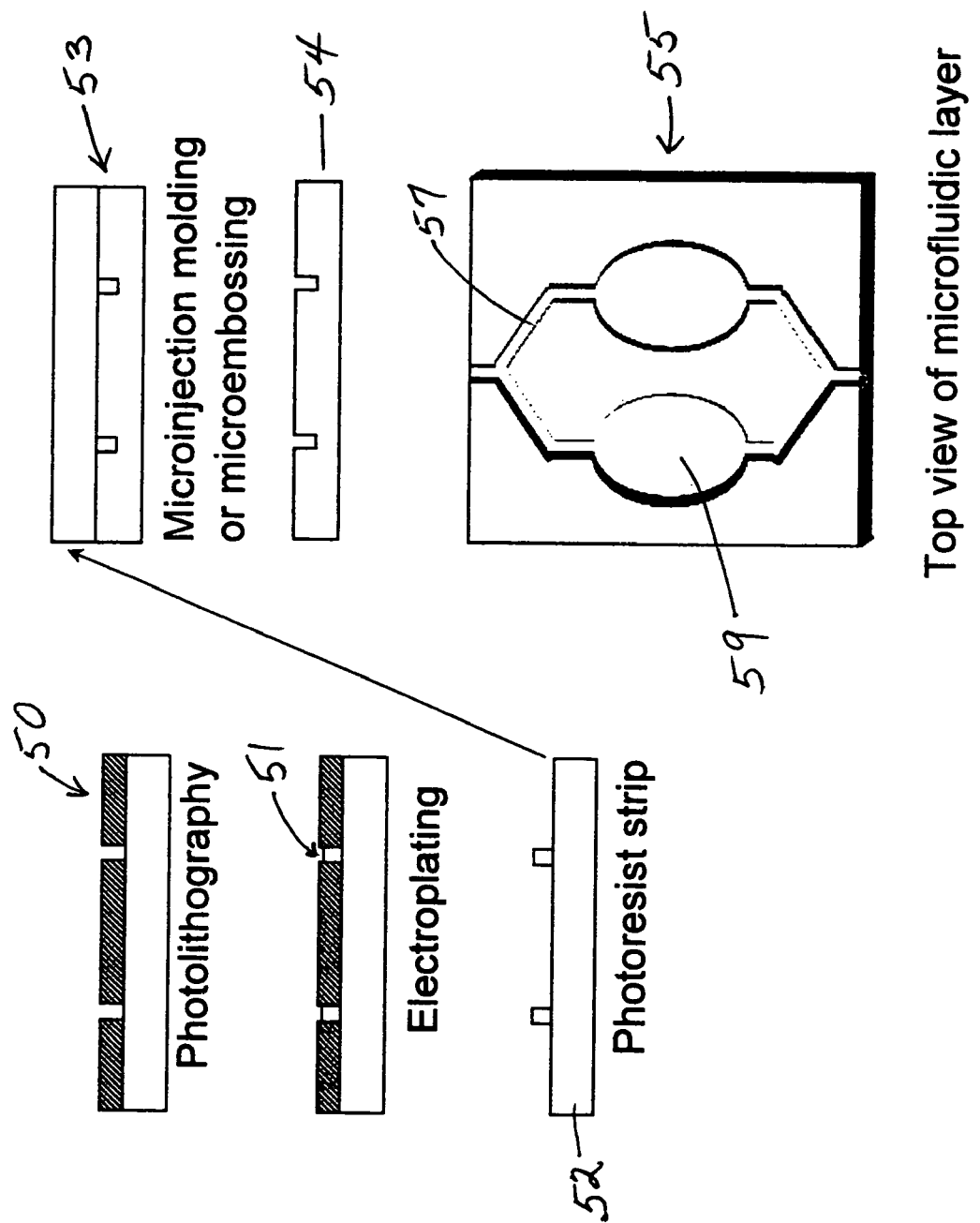
FIG. 5 shows one method of fabricating a microfluidic structure for a one-piece microfluidic package using electroplating followed by microinjection molding or microembossing.

FIG. 5 shows a fabrication method for a microfluidic structure with channels and reservoirs created in one side of a microfluidic package. Photolithography defines micro patterns on a first side, such as, a metal or metallized substrate 50 and electroplating is performed over the open area 51. A photoresist strip 52 is removed and a mold insert is made. The mold insert is used to replicate a pattern on the polymer material 53. It is also possible to use injection molding, casting or embossing to replicate a pattern onto a polymer material. A side view 54 and a plan view 55 of the completed microfluidic structure show channels 57 and reservoirs for fluids 59.

Figure 6:
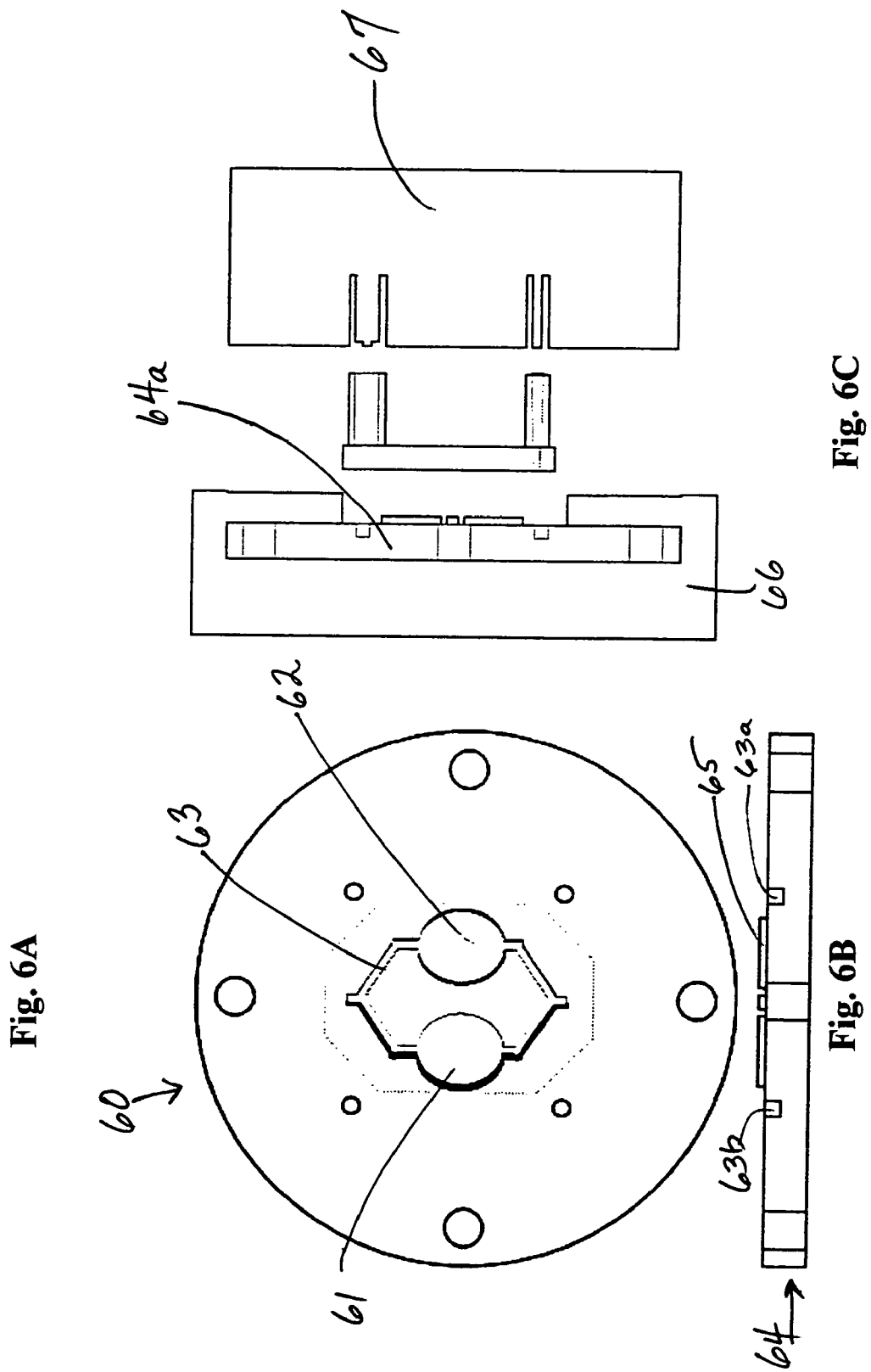
FIG. 6 shows the use of injection molding method for making a one-piece microfluidic package using mold insert and blocks.

FIG. 6 shows a fabrication method of the microfluidic package using mold blocks. In FIG. 6A, a plan view 60 of the mold insert that shows fluid reservoirs 61 and 62 connected to fluid channels 63. FIG. 6B is a cross-sectional view 64 of the mold insert and shows the location of fluid channels 63a and 63b and the raised surface 65 that is used to form the fluid reservoirs. In FIG. 6C, the fabricated mold insert 64a is clamped inside the mold form 66 and aligned with a mold block 67. Inlet and outlet ports in a second substrate 68 are defined by mold block 67, while the microfluidic structure is defined by mold insert 64 inside of mold block 66. The fabrication of mold block 67 is by a well-known method of EDM (electro-discharge machining) or the same technique illustrated in FIG. 5 can be used.

Figure 7:
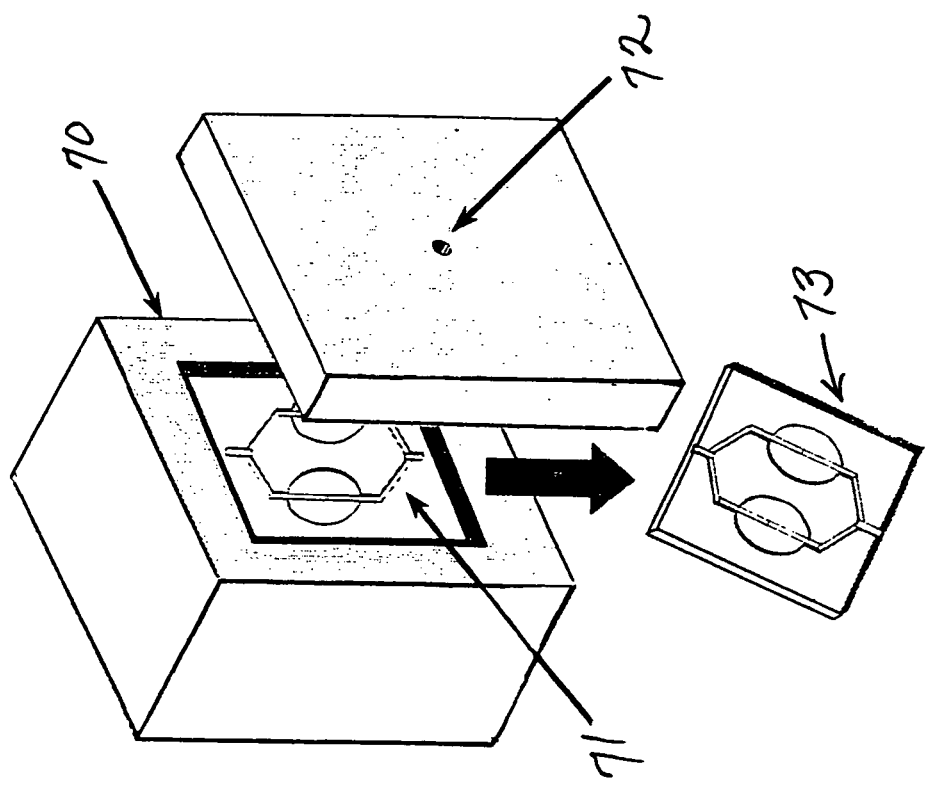
FIG. 7 shows the injection molding method of fabricating the one-piece microfluidic package.

A preferred method of fabricating the microfluidic package of the present invention is illustrated in FIG. 7, which is a perspective view of the injection molding process. Injection molding is a well-known process. A clamping block or mold 70 holds a mold insert 71. A molten, fluid polymer or polymer-based resin is inserted through nozzle 72 and is then allowed to cool and harden to replicate the pattern of 71, thereby forming a one-piece microfluidic package 73 having microfluidic channels with or without fluid reservoirs on a first substrate and inlet and outlet ports on a second substrate that engage by male-female friction fit.

FIG. 8 shows the microfluidic package of the present invention as an individual package and also as connected in a series. In FIG. 8A, a single package 80 includes a microfluidic structure with inlet/outlet ports 80a and 80b in a two-port design. Interconnected packages 81 are shown in a series where inlet/outlet ports 81a and 81b are at the peripheral ends of the series. Interconnecting ports 81c and 81d are used to join three individual microfluidic packages in one connected series. It is understood by persons skilled in the art that the interconnecting microfluidic structures could have multiple connections and configurations that extend in vertical and horizontal directions as long as there are available inlet/outlet ports that engage by male-female friction fit.

There are many value-added features of the novel microfluidic package disclosed herein, including, but not limited to, ease of manufacture, and increased utilization of known materials, versatility, reliability, accuracy and economy. The present invention resolves problems in fluidic interconnection by providing standardized, integrated inter-connections that easily combine and reconfigure devices using interlocking action. Thus, a common packaging platform is now available to form a flexible array of devices and components, which include, but are not limited to, a bio/biochemical/chemical sensor chip, a dielectrophoretic manipulator chip, and a microfluidic reactor chip.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A one-piece microfluidic package, wherein the one piece consists of:
    a) a first side on the one-piece microfluidic package having a plurality of interconnecting and interlocking ports, that includes at least one set of an inlet port and an outlet port, the one set including one male port and one female part, so that the ports engage other ports via a male-female friction fit that is leak-free and adhesive free to permit interconnecting and interlocking and snapping together of a plurality of one-piece microfluidic packages in an extended series;
    ai) an interior tube for the inlet port; and
    aii) an interior tube for the outlet port, each interior tube having a diameter of less than approximately 1.00 mm;
    b) a second side on the one-piece microfluidic package, that is opposite to the first side, the second side having one of a microfluidic channel and a combination of a microfluidic channel and a fluid reservoir, the first side and the second side together solely providing a one-piece, integrally formed, microfluidic package.

2. The microfluidic package of claim 1, further comprising at least one fluid reservoir.

3. The microfluidic package of claim 1, wherein the microfluidic channel is connected to a fluid reservoir.

4. The microfluidic package of claim 1, wherein the set of inlet and outlet ports has two ports.

5. The microfluidic package of claim 1, wherein there are a multiple of sets of inlet and outlet ports with a corresponding multiple of two ports per set.

6. The microfluidic package of claim 1, wherein the set of inlet and outlet ports has a first inlet and outlet port that is smaller than a second inlet and outlet port.

7. The microfluidic package of claim 6, wherein the first inlet and outlet port fits snugly and interlockingly into the larger second inlet and outlet port of an interconnecting microfluidic package.

8. The microfluidic package of claim 1, wherein the inlet and outlet ports have outlet tubes that have a pre-selected tubing size.

9. The microfluidic package of claim 8, wherein the outlet tubes have sizes with diameters selected from at least one of approximately 1.58 millimeters (mm) (1/16 inch), approximately 0.79 mm (1/32 inch), and approximately 0.396 mm (1/64 inch).

10. The microfluidic package of claim 1 wherein the interconnection in an extended series includes connection to a variety of devices.

11. The microfluidic package of claim 10 wherein the variety of devices are selected from a bio/biochemical/chemical sensor chip, a dielectrophoretic manipulator chip, and a microfluidic reactor chip.

12. The microfluidic package of claim 1, wherein each interior tube has a diameter of approximately 00.50 mm.

13. A series combination of one-piece microfluidic packages, consisting of:
    (a) a first one-piece microfluidic package consisting of:
        a first side on the first one-piece microfluidic package having at least one set of interconnecting ports, the set having an inlet port and an outlet port, the set including one male port and one female port;
        an interior tube for the inlet port on the first one-piece microfluidic package; and
        an interior tube for the outlet port, each interior tube having a diameter of less than approximately 1.00 mm;
        a second side on the first one-piece microfluidic package, that is opposite to the first side, the second side having one of a microfluidic channel and a combination of a microfluidic channel and a fluid reservoir, the first side and the second side of the first one-piece microfluid package together solely providing a one-piece, integrally formed first one-piece microfluidic package;
    (b) a second one-piece microfluidic package consisting of:
        a first side on the second one-piece microfluidic package having at least one set of interconnecting ports, the set having an inlet port and an outlet port, the set including one male port and one female port;
        an interior tube for the inlet port on the second one-piece microfluidic package;
        an interior tube for the outlet port on the second one-piece microfluidic package, each interior tube having a diameter of less than approximately 1.00 mm;
        a second side on the second one-piece microfluidic package, that is opposite to the first side, the second side having one of a microfluidic channel and a combination of a microfluidic channel and a fluid reservoir, the first side and the second side of the second one-piece microfluid package together solely providing a one-piece, integrally formed second one-piece microfluidic package, wherein the male port and the female port on the first one-piece microfluidic package interconnect and interlock and snap together in series with the male port and the female port on the second one-piece microfluidic package, so that the inlet and outlet ports engage one another via a male-female friction fit that is leak-free and adhesive free in an extended series.

14. The series combination of claim 13, wherein each interior tube has a diameter of approximately 00.50 mm.

15. The series combination of claim 13, wherein the outlet tubes have sizes with diameters selected from at least one of approximately 1.58 millimeters (mm) (1/16 inch), approximately 0.79 mm (1/32 inch), and approximately 0.396 mm (1/64 inch).

* * * * *